(12) United States Patent
Atchison et al.

(10) Patent No.: US 6,210,983 B1
(45) Date of Patent: Apr. 3, 2001

(54) METHOD FOR ANALYZING PROBE YIELD SENSITIVITIES TO IC DESIGN

(75) Inventors: Nick Atchison, Santa Cruz; Ron Ross, Scotts Valley, both of CA (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 09/333,787

(22) Filed: Jun. 15, 1999

Related U.S. Application Data

(60) Provisional application No. 60/105,140, filed on Oct. 21, 1998.

(51) Int. Cl.[7] ............................. G01R 31/26; H01L 21/66
(52) U.S. Cl. ............................ 438/14; 700/110; 700/121; 702/180; 716/4
(58) Field of Search ........................ 438/14, 16; 700/110, 700/121; 702/81, 84, 179, 180; 716/4, 19

(56) References Cited

U.S. PATENT DOCUMENTS

| | | |
|---|---|---|
| 5,440,478 | 8/1995 | Fisher et al. . |
| 5,479,340 | 12/1995 | Fox et al. . |
| 5,483,468 | 1/1996 | Chen et al. . |
| 5,598,341 * | 1/1997 | Ling et al. ..................... 700/110 |
| 5,777,901 | 7/1998 | Berezin et al. . |
| 5,862,054 | 1/1999 | Li . |

OTHER PUBLICATIONS

"Integrated Circuit Yield Management and Yield Analysis: Development and Implementation," by Charles H. Stapper and Raymond J. Rosner, IEEE Transactions on Semiconductor Manufacturing, vol. 8, No. 2, May 1995.

* cited by examiner

*Primary Examiner*—Charles Bowers
*Assistant Examiner*—Asok K. Sarkar
(74) *Attorney, Agent, or Firm*—W. Daniel Swayze, Jr.; Wade James Brady, III; Frederick J. Telecky, Jr.

(57) ABSTRACT

A method for predicting yield limits of semiconductor wafers in a factory, including the steps of generating a wafer probe test pareto, determining a histogram of the distribution from a selected group from the wafer probe test pareto, extracting parametric data from a database from the histogram, screening the parametric data for values of the parametric data outside of a predetermined range, determining if an average value of the screened parametric data shows a sensitivity to variations in the parametric data, determining specification limits of the screened parametric data, and using the specification limits to form an operating window to show the sensitivity.

1 Claim, 5 Drawing Sheets

FIG. 9

| CELL MIDPOINT | CELL PERCENT | # OBS |
|---|---|---|
| -6.8E-05 | 12.546 | 12230 |
| -6.4E-05 | 38.126 | 37167 |
| -6E-05 | 39.415 | 38423 |
| -5.6E-05 | 8.3439 | 8134 |
| -5.2E-05 | 1.2843 | 1252 |
| -4.8E-05 | 0.2154 | 210 |
| -4.4E-05 | 0.0523 | 51 |
| -4E-05 | 0.0082 | 8 |
| -3.6E-05 | 0.0062 | 6 |
| -3.2E-05 | 0.0031 | 3 |

HISTOGRAM LOWER BOUND = -7E-05   POINTS BELOW LOWER BOUND = 7137
HISTOGRAM UPPER BOUND = -3E-05   POINTS ABOVE UPPER BOUND = 31

ACCEPT:    PROD:    SPEC:

FIG. 10

| CELL MIDPOINT | CELL PERCENT | # OBS |
|---|---|---|
| 162 | 0 | 0 |
| 166 | 0 | 0 |
| 170 | 0 | 0 |
| 174 | 0 | 0 |
| 178 | 0 | 0 |
| 182 | 0 | 0 |
| 186 | 0 | 0 |
| 190 | 3.9164 | 30 |
| 194 | 14.36 | 110 |
| 198 | 15.666 | 120 |
| 202 | 12.402 | 95 |
| 206 | 7.1802 | 55 |
| 210 | 17.755 | 136 |
| 214 | 25.326 | 194 |
| 218 | 1.9582 | 15 |
| 222 | 0 | 0 |
| 226 | 0 | 0 |
| 230 | 0.6527 | 5 |
| 234 | 0 | 0 |
| 238 | 0.7833 | 6 |

HISTOGRAM LOWER BOUND = 160   POINTS BELOW LOWER BOUND = 0
HISTOGRAM UPPER BOUND = 240   POINTS ABOVE UPPER BOUND = 9

ACCEPT:    PROD:    SPEC:

METHOD FOR ANALYZING PROBE YIELD SENSITIVITIES TO IC DESIGN

CROSS-REFERENCES TO RELATED APPLICATIONS

This application claims the benefit of Provisional Application No. 60/105,140 filed Oct. 21, 1998.

The copending patent application bearing attorney docket number TI-28372, titled "An Improved Computer Program for Calculation of Parametric Yield Limits," filed Jun. 15, 1999, is incorporated by reference in its entirety.

The copending patent application bearing attorney docket number TI-28447, titled "Method for the Calculation of Wafer Probe Yield Limits from In-Line Defect Monitor Data," filed Jun. 15, 1999, is incorporated by reference in its entirety.

The copending patent application bearing attorney docket number TI-28570, titled "Method of a Comprehensive Sequential Analysis of the Yield Losses of Semiconductor Wafers," filed Jun. 15, 1999, is incorporated by reference in its entirety.

The copending patent application bearing attorney docket number TI-28574, titled "A New Method for Wafer Zone Based Yield Analysis," filed Jun. 15, 1999, is incorporated by reference in its entirety.

FIELD OF THE INVENTION

The present invention generally relates to semiconductor wafer manufacture in the presence of particle contamination, and more particularly to the field of yield forecasting in a real-time semiconductor wafer manufacturing environment.

BACKGROUND OF THE INVENTION

Fabrication of semiconductor integrated circuits (ICs) is an extremely complex process that involves several hundred or more operations. They are fabricated by selectively implanting impurities into and applying conductive and insulative layers onto a semiconductor substrate. Semiconductor ICs (chips) are not manufactured individually but rather as an assembly of a hundred or more chips on a "wafer," which is then diced up to produce the individual chips.

Increasing production yield is an ongoing problem in the manufacture of semiconductor chips. Because of various defects that can occur in the fabrication of a wafer, a significant number of wafer die have to be discarded for one reason or another, thereby decreasing the percentage yield per wafer and driving up the cost of the individual chips. Defects are typically caused by foreign particles, minute scratches, and other imperfections introduced during photoresist, photomask, and diffusing operations. Yield impacts the number of wafer starts at the inception of production needed to meet specific customer order quantities for finished chips at the end of the production line. With the high demand for semiconductor chips and more orders than can possibly be filled by a production facility, predicting yield to accurately gauge wafer starts and utilizing defect information to remove yield-detracting operations are important aspects of improving the efficiency and hence the output of the fabrication facility.

Wafer-scanning tools are utilized to identify defects that occur in the chip manufacturing process for the aforementioned purposes. Typically, such tools are located at a variety of positions along the production line and include automated-vision inspection stations for identifying visual irregularities in the wafer die as they move through the line. The irregularities, i.e., defects, are recorded according to their coordinates, estimate of size, or other parameters and are stored as records in a database. The records represent raw information that is then analyzed or otherwise processed offline to determine the impact, if any, of the identified defects on product yield. Some defects, for example, may not adversely affect yield as much as others, and correspondingly must be classified differently for analysis purposes.

Commercially available wafer scanning tools include those made by KLA Instruments Corporation of Santa Clara, Calif.; Tencor Instruments Corporation of Mountain View, Calif.; Inspex, Inc. of Billerica, Mass.; and numerous other manufacturers. Despite significant advances made in waferscanning technology, the various tools that are available suffer striking deficiencies. In particular, such tools lack the capability to perform certain advanced classification and analysis of defect information necessary to accurately determine the true impact of wafer defects on yield. While conventional tools offer simple data presentation capabilities, such as the display of wafer maps, histograms and charts, they do not adequately classify or process the defect data.

More specifically, a disadvantage suffered by scanning tools is that they do not adequately perform yield prediction operations beneficial in a manufacturing defect analysis, thereby limiting the utility. It is often desirable to further refine the defect data before manual inspection and classification of individual defects on the review station. Since each wafer can include so many defects, it would not be practical to manually review and classify each of them. It would be desirable to utilize a method to randomly choose a statistically meaningful sample, i.e., subset, of such defects for consideration.

Historically, the review station operator randomly picks sets of defects that seem interesting and then reviews and classifies them. However, it is difficult for humans to systematically choose defects for this purpose that will be representative of all of the defects on the wafer. Some review stations are equipped with the ability to randomly move to different defects which the operator can then review and classify. A problem though with conventional randomizing methods performed on review stations is that they are not necessarily accurate in representing a true sampling of the wafer. For example, picking defects at random tends to result in the inordinate picking of defects that are part of a big cluster, because there are more of them, while defects of other types and in other locations on the wafer are overlooked. Therefore, it would be desirable to adopt an automated and consistent method for randomly identifying for review defects of interest. This method could focus on defect subpopulations defined in terms of defect size ranges or, alternatively, in terms of locations on the wafer, so that the sample of defects chosen best reflects the conditions actually occurring on the wafer.

FIGS. 1 and 2 illustrate a semiconductor wafer 2, which includes five particles 4, and the semiconductor wafer 2' contains eleven particles 4'.

FIG. 3 illustrates a schematic illustration of a semiconductor device in a semiconductor wafer. Circuit conductor lines 6 and 8 are designed in the semiconductor wafer to conduct electrical signals independently of one another. Due to imperfections in the semiconductor wafer manufacturing process, particle 10 has been introduced between conductors 6 and 8. Particle 10 does not interfere with either of conductors 6 and 8 and will generally not affect the functionality (or yield) of the semiconductor device or wafer. Accordingly, even though particle 10 is a result in a defect in the semiconductor wafer manufacturing process, the particle does not cause failure in the semiconductor device by disturbing signals flowing in conductors 6 and 8.

FIG. 4 is also a schematic illustration of a portion of a semiconductor device similar to the illustration of FIG. 3. However, in FIG. 4, particle 10' is much larger than particle 10 of FIG. 3. In this example, particle 10' is in contact with both conductors 6 and 8 at regions 12 and 14, respectively. If particle 10' is able to conduct electricity, the independent operation of conductors 6 and 8 will be jeopardized, creating cross-talk between conductors 6 and 8. If different devices are connected to conductors 6 and 8, a single particle 10' may destroy the two devices embedded in the semiconductor wafer. Accordingly, particle 10' is what is commonly known as a "killer defect" since particle 10' may kill or prevent the normal operation of the semiconductor device which utilizes conductors 6 and 8. While the presence or absence of killer defects may be determined, it is important to utilize the defect characteristics in a semiconductor wafer.

FIGS. 5 and 6 are schematic illustrations of a portion of a semiconductor device for providing some additional background information regarding semiconductor defects. In FIG. 5, semiconductor device conductor lines 16 and 18 are separated by the distance 20. During the manufacturing process, particle 22 is introduced in the semiconductor wafer due to manufacturing defects or imperfections. Particle 22 has a diameter 24 and center point 26 as illustrated. In the situation illustrated in FIG. 5, particle 22 is in contact only with conductor 16 and is unable to be extended to contact both conductors 16 and 18. Therefore, particle 22 is considered to be a non-killer defect. Note that in this situation, the position of center 26 of particle 22, identified by dashed line 30, is spaced apart from the center position 28 of conductors 16 and 18 by distance 32. As particle 22 moves closer toward conductor 18, the center 26 of particle 22 will also move closer to center 28 or conductors 16 and 18 as illustrated in FIG. 6.

As shown in FIG. 6, the center 26 of particle 22 has moved closer to the center 28 of conductors 16 and 20. This is illustrated by the distance between center 28 and center line 30' being 32' which is smaller than the distance 32 in FIG. 5. Particle 22 is in contact with both conductors 16 and 20 and, correspondingly, is considered a killer defect. Thus, as the center 26 of particle 22 is moved closer to center 28 of conductors 16 and 20, the particle 22 will become more likely a killer defect. This, of course, presumes that particle 22 is large enough to be in simultaneous contact with both conductors 16 and 20.

SUMMARY OF THE INVENTION

The present invention includes a method for predicting yield limits of semiconductor wafers in a factory, including the steps of generating a wafer probe test pareto, determining a histogram of the distribution from a selected group from the wafer probe test pareto, extracting parametric data from a database from said histogram, screening the parametric data for values of the parametric data outside of a predetermined range, determining if an average value of said screened parametric data shows a sensitivity to variations in the parametric data, determining specification limits of the screened parametric data, and using the specification limits to form an operating window to show the sensitivity.

These, together with other objects and advantages which will be subsequently apparent, reside in the details of construction and operation as more fully herein described and claimed, with reference being had to the accompanying drawings forming a part hereof wherein like numerals refer to like elements throughout.

BRIEF DESCRIPTION OF THE DRAWINGS

FIG. 9 illustrates a histogram for a test parameter;

FIG. 10 illustrates a distribution for an electrical parameter;

DETAILED DESCRIPTION OF THE PRESENT INVENTION

The invention is an analytical method and apparatus that can detect IC design sensitivities which adversely affect wafer probe yields. The present invention includes a method that can also detect systematic process problems that affect wafer probe yields. The method of the present invention detects the sensitivities and provides information about why the wafer probe yield is affected. Additionally, quantitative yield limits can be calculated for each detected sensitivity, and as a result it is possible to create a wafer yield loss pareto. Furthermore, it is possible to concentrate improvement efforts on the wafer yield sensitivities causing the greatest loss.

The method of the present invention provides accurate and reliable results when performed on data based on fewer test wafers than may have been required for other prior art techniques. The present invention is particularly adapted to an automatic computer program on a computer to perform the analysis.

The present invention is a method for relating parametric tests that are performed at wafer probe (e.g., output levels, offsets, frequency responses, etc.) to obtain various device parametrics such as transistor betas, threshold voltages for field effect transistors, sheet resistances, etc. The method of the present invention uses parametric values obtained site-by-site at various locations on the wafer. Therefore, if device parameters vary significantly across the wafer, which is so often the case, greater sensitivity is achieved than using wafer averaging techniques. This translates into a fewer number of wafers needed for analysis than the number normally required, divided by the number of sites on the wafer for which the parameters are measured.

The method of the present invention divides the site device parameter data into three groups (e.g., low, medium, and high) and averages the probe parameter data for these groups. The device parameters and the probe parameters are then plotted in the form of three points for these groups to form a graph. The device parameter specification limits and the probe parameter specification limits are superimposed on the graph to create an operating window. These three points are the basis to form a line, and this line is extrapolated to the sides of the box representing the device parameter specification limits. If this line extends above or below the probe parameter limits, then there is a sensitivity of the probe parameter to the device parameter which could result in wafer probe yield loss. The criteria for deciding if this situation exists and methods for quantifying the yield loss are described by the present invention.

The method of the present invention is useful for pinpointing design sensitivities and process sensitivities early in the development cycle of new products.

Figure 1:
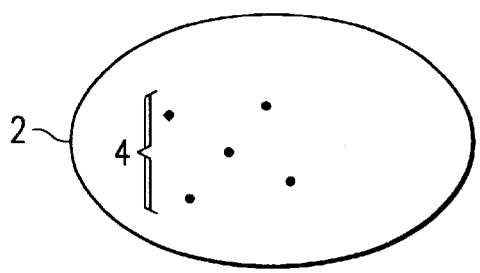
FIG. 1 is an illustration of a semiconductor wafer with a small particle count.
Figure 2:
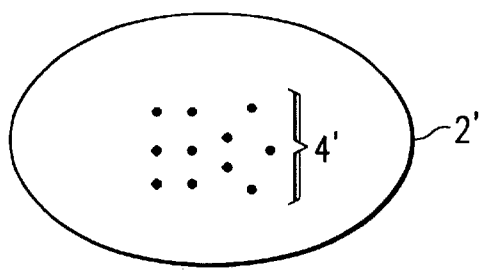
FIG. 2 is an illustration of a semiconductor wafer with a high particle count.
Figure 3:
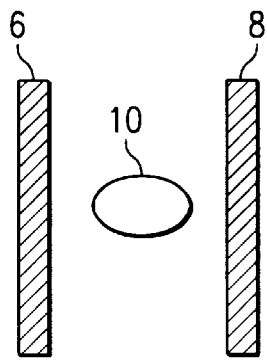
FIG. 3 is an illustration of a portion of a semiconductor device where no killer defects are experienced.
Figure 4:
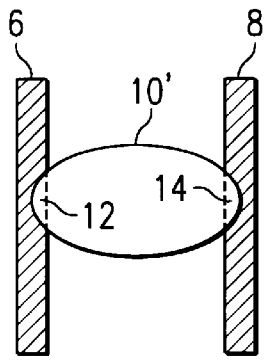
FIG. 4 is an illustration of a portion of a semiconductor device which has experienced a killer defect.
Figure 5:
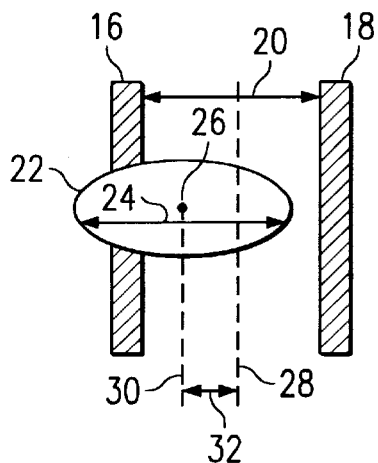
FIG. 5 is an illustration of a semiconductor device describing the relationship of the center of the particle and the center of the device conductors when no killer defect is present.
Figure 6:
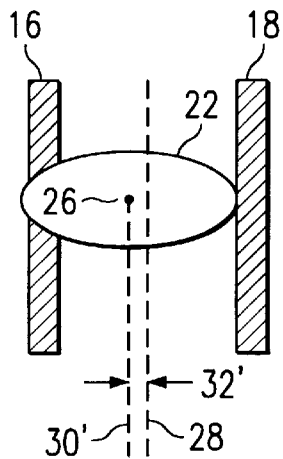
FIG. 6 is an illustration of a semiconductor device describing the relationship between the center of the particle and the center of the device conductors when a killer defect is present.
Figure 7:
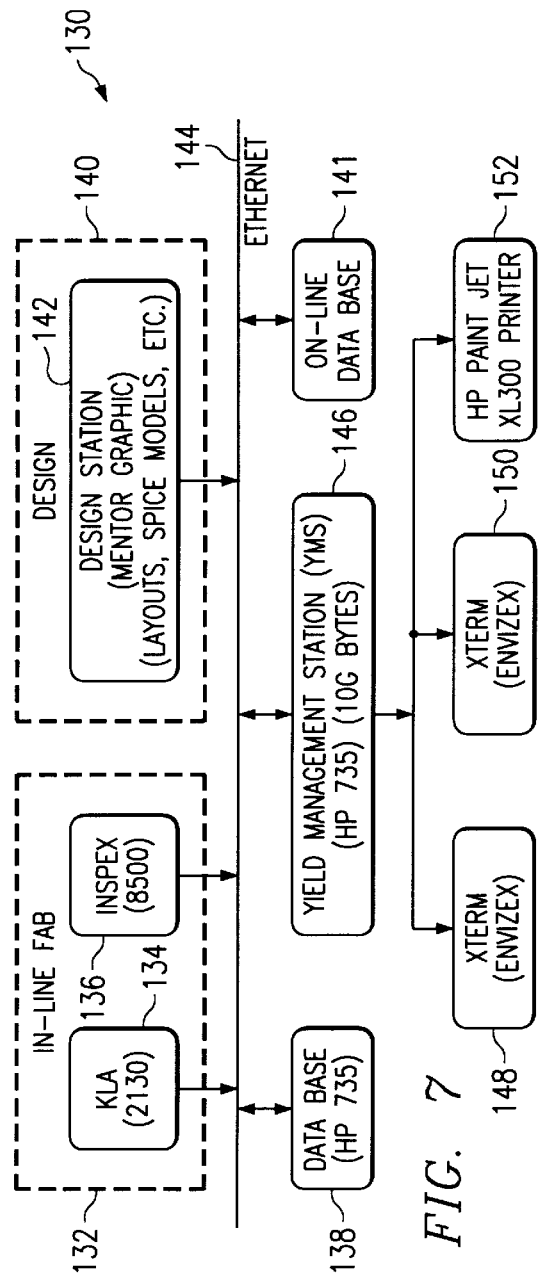
FIG. 7 is a block diagram illustrating a real-time in-line defect disposition and yield forecasting system.

FIG. 7 is a block diagram of the equipment in the real-time, in-line defect disposition and yield forecasting system. As shown in FIG. 7, the real-time, in-line defect disposition and yield forecasting system 130 includes an in-line fabrication equipment 132 which collects different particle sizes and locations of the particle sizes with respect to different layers in a semiconductor wafer. For example, the in-line fabrication equipment KLA 2130 manufactured by KLA Company in Sunnyvale, Calif., identified by reference numeral 134, or the INSPEX 8500 fabrication equipment manufactured by INSPEX Company in Boston, Mass., identified by reference numeral 136, may be used. The collected data is then transmitted via Ethernet drive transmission line 144 to data base 138. For example, the Hewlett Packard 735 computer includes such a function of collecting the data output from the in-line fabrication equipment 132 and storing for later retrieval.

In addition, the defect disposition and yield forecasting system 130 includes design station equipment 140 such as the design equipment 142 manufactured by Mentor Graphics in Oregon. Design station 142 is able to extract the various layouts for each layer in the semiconductor wafer as previously discussed. These layouts are then stored in data base 141 via Ethernet driven transmission line 144. The particle size and locations stored in data base 138 and the layout information stored in database 141 are then collected by the yield management station (YMS) 146 to determine the number and location of actual defects, as well as the defect sensitive area index for each of the layers in the semiconductor wafer under examination. Yield management station 146 can be, for example, Hewlett Packard's 735 computer with preferably 10 gigabytes of hard disk memory storage or more programmed in accordance with the present invention. The particle size and location information and layout information are then analyzed as described in connection with the present invention, the results of which are then displayed on monitors 148 and 150 or printed on printer 152. Examples of monitors 148 and 150 are the Exterm Display manufactured by Envizex. An example of the printer 152 is the Hewlett Packard Paint Jet XL300 printer.

Accordingly, the real-time in-line defect disposition and yield forecasting system is able to determine the number of actual defects caused for each layer of a semiconductor wafer and is also able to determine the defect sensitive area index for each layer of the semiconductor wafer. Using this detailed information, the real-time in-line defect disposition and yield forecasting system is able to accurately determine the status or condition of each layer of the semiconductor wafer to determine the layer which has the highest yield probability or possibility after inspection and analysis. Accordingly, the defect disposition and yield forecasting system is able to efficiently and effectively determine which layer of a semiconductor wafer requires inspection and analysis to correct device defects. The defect disposition and yield forecasting system is consequently able to optimize the amount of device defects in accordance with the present invention which may be corrected for different layers in the semiconductor wafer.

Figure 8:
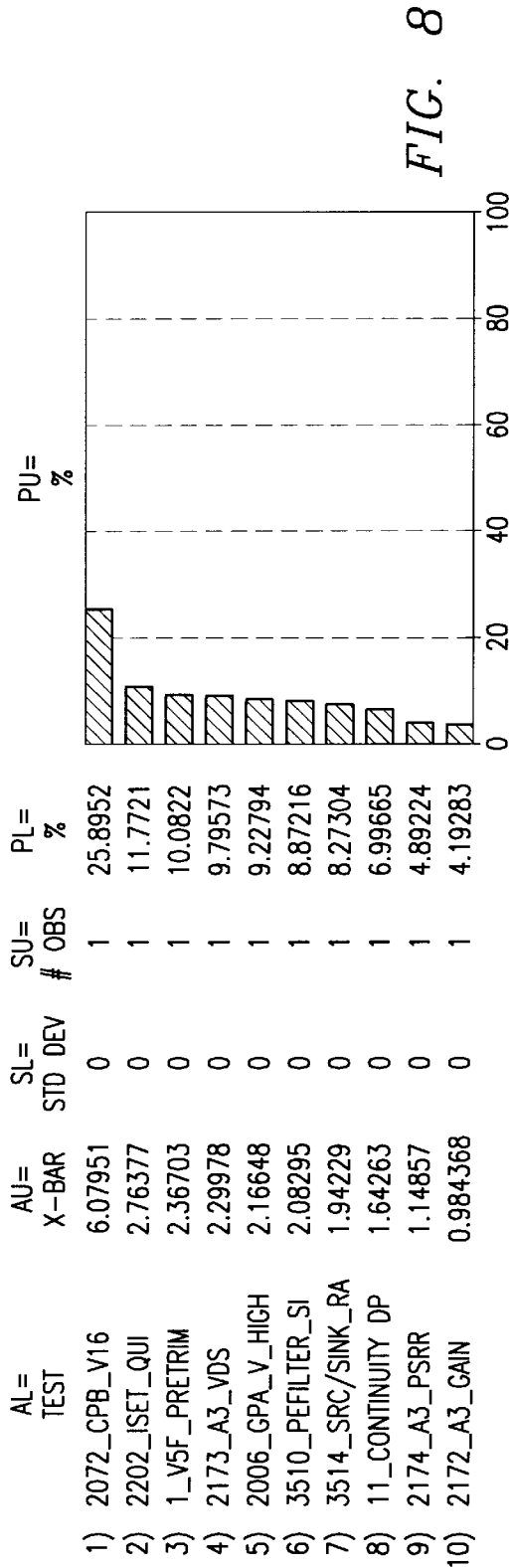
FIG. 8 illustrates a test pareto for a product.

FIG. 8 illustrates an example of a test pareto for a typical product. FIG. 8 illustrates ten tests, which a wafer is subject to. These are numbered 1–10 to the left of FIG. 8. Thus, the first step of the analysis is to generate a wafer probe test pareto for a group of wafers from different lots. Typically a lot is a lot of wafers that are subject to the same process, preferably, sixty wafers from at least three different lots could be used. The pareto should be in terms of percent of dice failing going into each test. Other pareto including absolute numbers could be used as illustrated in FIG. 8, the left-most column indicates the name of the test. Moving rightwise, the mean for each test is illustrated. Next, the standard deviation is illustrated. Next, the number of observations is illustrated. And, lastly, the percentage of dice failing going into each test is illustrated. Typically, tests that would be included are tests that measure actual parametric values by a variable number of states. The tests are not applicable to tests having a fixed number of states, e.g., pass/fail tests or open/short failure tests. This pareto makes it possible to select the wafer probe parameters with the highest failure rates on which to perform the to Programmable System Architecture.

The next step is to plot histograms of the distribution of each of the few top tests on the pareto. The basis for which to plot the histograms could be the failure rates. For example, a test with a failure rate $\geq 0.5\%$ could be included. The only test in FIG. 8 that meets this criteria is the first test, namely test 2072_GPB_V16. This has a mean of 6.07951.

FIG. 9 illustrates a histogram for the test 2072_GPB_V16. The upper and lower axes of the histogram represent the specification limits which are the upper and lower limits of the desired range of values measured during a test. The histogram illustrates that the distribution is not centered between the specification limits, and there is a high failure rate at the low end (more negative) of the spec. The PSA analysis makes it possible to determine whether this is because of a design sensitivity or a process sensitivity, and also to which device parameters the test may be sensitive.

After a probe parameter has been chosen for which significant yield loss is occurring, the appropriate data is extracted from the database. For example, all of the device or all of the electrical parameters for each site is tested. The parameters for all of the wafers in the sample are extracted and placed in a table with a lot number, wafer number, and site number to identify each set of parameters. The values for the probe parameter in question for those dice immediately surrounding the electrical test site are extracted. These values are averaged and are merged by site into a table containing the device parameters.

Subsequent to the extraction, but before the averaging, the electrical parameters and probe parameters are screened so that values falling outside, for example, a typical distribution of the appropriate parameter are not included within the analysis. The limits for the screening would be typically somewhat wider than the spec limits, e.g., two or three standard deviations above and below the spec limits.

Once the electrical and probe parameters have been screened and merged by site into a table, each electrical parameter is subdivided into three blocks of data. The number of blocks of data could vary; however, three has been chosen for illustrative purposes. These sites would be separated by low value, by intermediate value, and by high value. FIG. 10 illustrates an example of a distribution for a typical electrical parameter. It shows an intermediate value between a lower bound and upper bound. Typically, each of the three blocks should have an equal number of sites in each block. After the data is subdivided, the electrical parameter is averaged for each block, and, correspondingly, the values for the probe parameter in question are averaged for each group of sites. This averaging is performed in an attempt to eliminate by averaging the independent effects which could have an influence or effect on the probe parameter. Additionally, noise should be eliminated by the averaging from the measurements.

The average values for the electrical parameter for the three blocks are plotted with respect to the averages for the probe parameter for the respective block. If this plot shows a significant slope, then as a consequence the probe parameter can be said to be sensitive to variations in the electrical parameter. Whether or not these variations are a problem will be illustrated next.

Finally, the spec limits for the electrical parameters are extracted and plotted vertically, although horizontally could be performed equally well, on a graph. The spec limits for the probe parameter are extracted and plotted horizontally on the graph. This generates an operating window.

Figure 11:
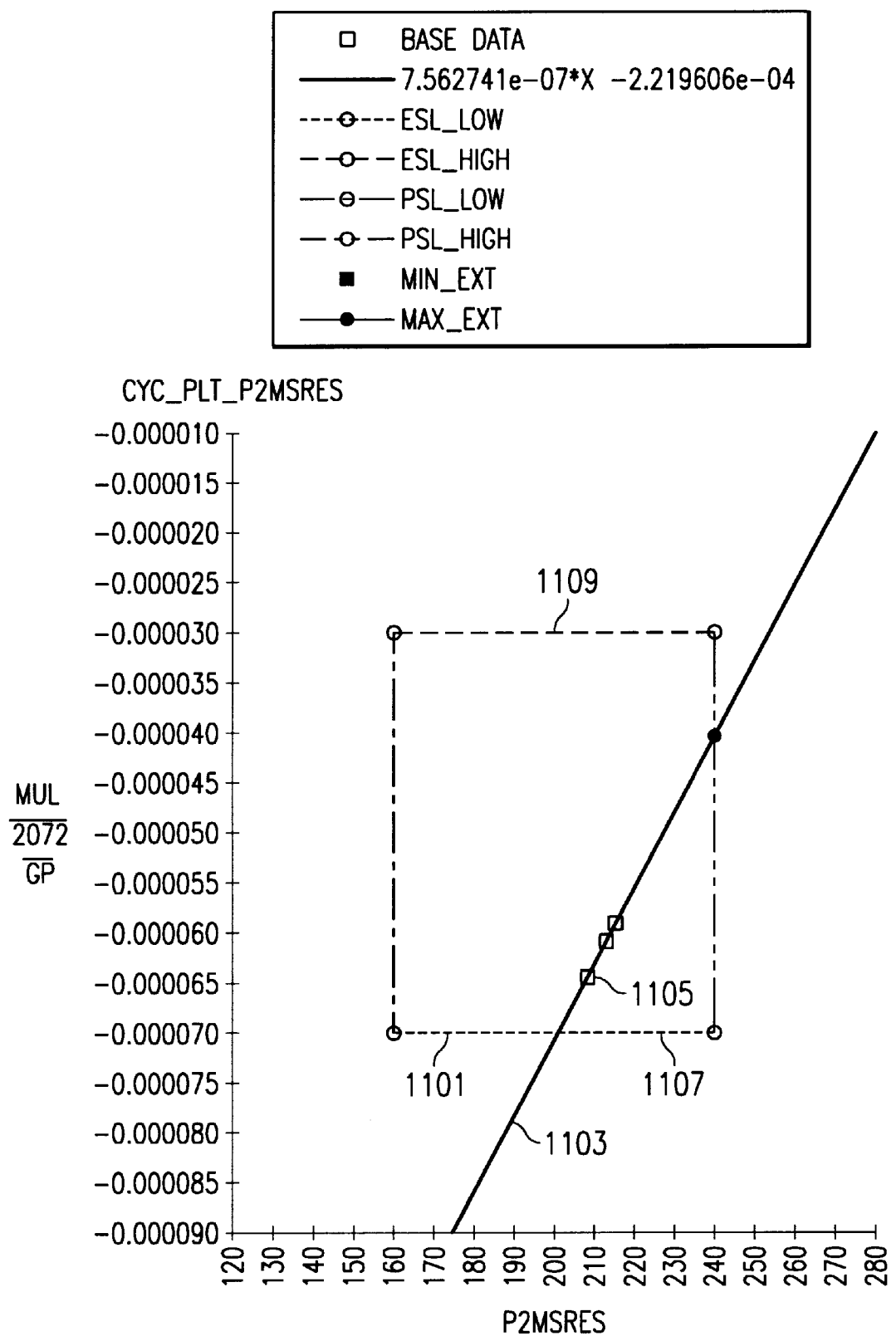
FIG. 11 illustrates a resulting graph of an actual example.

FIG. 11 illustrates the operating window 1101. In FIG. 11, it can be seen that there is a significant sensitivity of the probe parameter (GPB) to the electrical parameter (P2_MsRes Poly 2 Medium Sheet Resistance). This sensitivity is illustrated by the slope of curve 1103. Additionally, the curve 1103 is not well centered between spec limits (1107 & 1109). Thus, the curve 1103 is a best-fit line and extends below the lower spec limit 1107 of the probe parameter while still being within the electrical test spec case. From this, it is apparent that there is a yield problem. Assuming that the linear relationship of curve 1103 extends for higher values of P2_MsRes, the probe parameter would start to fail at approximately 200, which is well above the lower spec limit of 160.

Still referring to FIG. 11, the lower point 1105 of the three points is an average of many sites (the block with low P2_MsRes). Therefore, there are potentially data points included within the average which fall below the spec limit for the probe parameter. In fact, many points did fall below the line, and a significant yield loss resulted of approximately 7%. In contrast, the curve of FIG. 12, namely curve 1203, illustrates a test which is not sensitive to a particular electrical parameter.

In contrast, FIG. 11 illustrates curve 1103 which illustrates a design problem because the design should encompass the entire spec range of 160 to 240 for P2_MsRes. It is possible to show only a graph which shows yield loss.

The calculation of systematic yield limits from the data used to generate a graph such as FIG. 11 is now discussed. The fractional yield loss is the number of dice falling above or below the probe spec limits divided by the total number of dice going into the test. Carefull analysis is advised when using yield limits to calculate the overall yield by multiplying particular yield limits together. When a particular probe parameter is sensitive to more than one electrical parameter, and where the electrical parameters illustrate a high degree of correlation, the yield limits must be adjusted to take this into account. This adjustment should be made to avoid counting the same yield limits more than one time. If yield limits resulting from parametric sensitivities in which the electrical parameters correlate were all included separately in the model, the calculated yield would be significantly lower than the actual yield.

Figure 12:
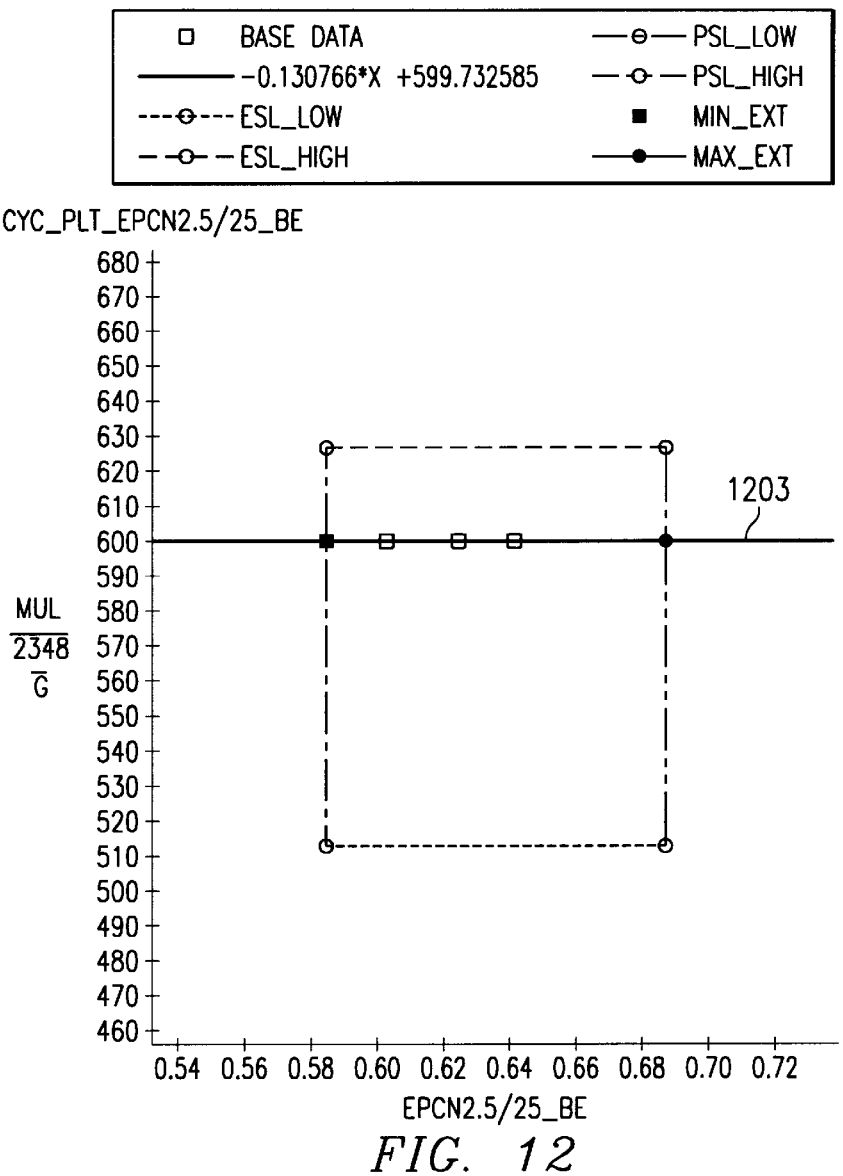
FIG. 12 illustrates a graph used in the calculation of systematic yield limits.

The results of the analysis are more consistent because the method is more systematic. Because the calculation methodology fits into an overall evaluation method, it is possible to apportion the required amount of loss that is needed to be accounted for by product yield sensitivities. The calculation as shown in FIG. 12 is attained by the fractional yield loss which is the number of dice falling above or below the probe spec limits divided by the total number of dice going into the test. Additionally, an advantage is gained when using yield limits to calculate the overall yield by multiplying the limits together. It is now possible to detect when a particular probe parameter is sensitive to more than one electrical parameter by correlation analysis. Where the electrical parameters show a high degree of correlation, the yield limits must be adjusted to take this into account. These adjustments must be made in order to avoid double counting the same yield limits.

Figure 13:
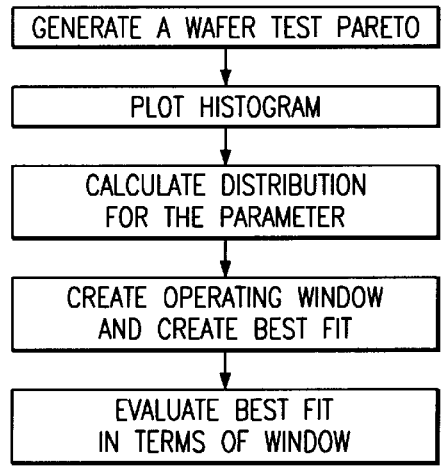
FIG. 13 illustrates a method of the present invention.

FIG. 13 illustrates the steps of generating a wafer test Pareto, plotting a histogram, calculating a distribution for the parameter, creating an operating window and creating a best fit, and evaluating the best fit in terms of the window.

The analysis method provided hereinabove is an effective mathematical/graphic method for identifying and quantifying wafer probe yield loss caused by design sensitivities to electrical parameter variations. The analysis method of the present invention provides valuable information about which electrical parameters affect specific parametric tests performed at the wafer probe. The analysis method of the present invention can be performed early in the product development cycle rather than waiting until a significant number of wafers have been processed and tested. Quantitative yield limits for each sensitivity can be calculated, making it possible to prioritize yield improvement projects. The method of the present invention enhances the value of the measurements taken at both wafer sort and parametric test. The present invention provides an automated method.

What is claimed is:

1. A method for predicting yield limits of semiconductor wafers in a factory, comprising the steps of:
   generating a wafer probe test pareto;
   determininig a histogram of the distribution from a selected group from the wafer probe test pareto;
   extracting parametric data from a database from said histogram;
   screening the parametric data for values of the parametric data outside of a predetermined range;
   determining if an average value of said screened parametric data shows a sensitivity to variations in said parametric data;
   determining specification limits of said screened parametric data; and
   using said specification limits to form an operating window to show said sensitivity.

* * * * *